US008612820B2

(12) United States Patent
van Veen et al.

(10) Patent No.: US 8,612,820 B2
(45) Date of Patent: Dec. 17, 2013

(54) APPARATUS AND METHODS FOR INTERLEAVING IN A FORWARD LINK ONLY SYSTEM

(75) Inventors: Durk L. van Veen, Santee, CA (US); Murali R. Chari, San Diego, CA (US); Thomas Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 483 days.

(21) Appl. No.: 12/756,917

(22) Filed: Apr. 8, 2010

(65) Prior Publication Data

US 2010/0260161 A1    Oct. 14, 2010

Related U.S. Application Data

(60) Provisional application No. 61/168,596, filed on Apr. 11, 2009.

(51) Int. Cl.
*G06F 11/00*     (2006.01)

(52) U.S. Cl.
USPC .................. 714/752; 714/755; 714/756

(58) Field of Classification Search
None
See application file for complete search history.

(56) References Cited

U.S. PATENT DOCUMENTS

| | | | |
|---|---|---|---|
| 6,339,781 B1 | 1/2002 | Sasaki | |
| 6,598,202 B1 | 7/2003 | Kim et al. | |
| 6,625,234 B1 | 9/2003 | Cui et al. | |
| 6,973,611 B2 | 12/2005 | Dabak et al. | |
| 7,490,282 B2 | 2/2009 | Spencer et al. | |
| 7,646,805 B2 * | 1/2010 | Cho | 375/228 |
| 7,992,070 B2 * | 8/2011 | Djordjevic et al. | 714/755 |
| 2001/0033560 A1 | 10/2001 | Tong et al. | |
| 2002/0114270 A1 * | 8/2002 | Pierzga et al. | 370/208 |
| 2002/0126763 A1 | 9/2002 | Jeong et al. | |
| 2002/0181603 A1 | 12/2002 | Kim et al. | |
| 2003/0043928 A1 | 3/2003 | Ling et al. | |
| 2003/0063606 A1 | 4/2003 | Odenwalder et al. | |
| 2003/0188247 A1 * | 10/2003 | Ahmed et al. | 714/755 |
| 2005/0141475 A1 | 6/2005 | Vijayan et al. | |
| 2006/0101168 A1 | 5/2006 | Roh et al. | |
| 2006/0183287 A1 * | 8/2006 | Collins et al. | 438/278 |
| 2006/0198454 A1 * | 9/2006 | Chung et al. | 375/260 |
| 2006/0218472 A1 | 9/2006 | Dahl et al. | |

(Continued)

FOREIGN PATENT DOCUMENTS

CN    101040478 A    9/2007
CN    101091346 A    12/2007

(Continued)

OTHER PUBLICATIONS

Rohde&Schwarz (ATSC Mobile DTV; Application Note; 05-2009-7EB01-OE).

(Continued)

*Primary Examiner* — Christopher McCarthy
(74) *Attorney, Agent, or Firm* — Fulbright & Jaworski LLP

(57) ABSTRACT

Methods and devices for encoding and interleaving data packets for broadcast and for de-interleaving and decoding data packets in a communication system eliminate detrimental biasing effects by using pseudo-random M-sequence bit encoding as part of the turbo encoding and decoding. The use of pseudo-random M-sequence bit encoding mitigates biasing effects that may otherwise be introduced if conventional r-c interleaving is applied to long turbo encoded data which would degrade reception in the presence of broadcast interference.

29 Claims, 12 Drawing Sheets

(56) References Cited

U.S. PATENT DOCUMENTS

| | | | |
|---|---|---|---|
| 2007/0088971 A1 | 4/2007 | Walker et al. |
| 2007/0157065 A1 | 7/2007 | Pons et al. |
| 2008/0020786 A1 | 1/2008 | Smith et al. |
| 2008/0087729 A1 | 4/2008 | Yee et al. |
| 2009/0013356 A1 | 1/2009 | Doerr et al. |
| 2009/0059086 A1 | 3/2009 | Lee et al. |
| 2009/0235141 A1 | 9/2009 | Shelby et al. |
| 2009/0268694 A1 | 10/2009 | Sun et al. |
| 2011/0047434 A1 | 2/2011 | Walker et al. |

FOREIGN PATENT DOCUMENTS

| | | |
|---|---|---|
| WO | WO2006126004 A1 | 11/2006 |
| WO | WO2007115333 A2 | 10/2007 |
| WO | WO2009134703 | 11/2009 |

OTHER PUBLICATIONS

3GPP TS 25.101 ;Third Generation Partnership Project; Technical Specification Group Radio Access Network; User Equipment (UE) radio transmission and reception (FDD);3GPP TS 25.101 version 5.20.0 Release 5; Dec. 2006.

Advanced Television Systems Committee: "ATSC Mobile DTV Standard, Part 2—RF/Transmission System Characteristics (A/1 53 Part 2.2009)", Internet Citation, Oct. 15, 2009 (Oct. 1 5, 2009), pp. 1-94, XP002571574, [retrieved on Mar. 2010-051].

Lin, et al. "Performance Comparison of the DVB-H and FLO Mobile Broadcasting Systems", Consumer Electronics, 2007. ISCE 2007. IEEE International Symposium on, IEEE, Pl. Jun. 1, 2007. pp. 1-6 XP031160314, ISBN: 978-1-4244-1109-2 the whole document.

TIA: "Forward Link Only Air Interface Spcification Rev. 1.1" Internet Citation Dec. 22, 2005 , XP002387062, Retrieved from the Internet: URL:http://ftp.tiaonline.org/TR-47/TR471/Working/20060110-Arlington-meeting1/TR471-20060110-004a_Flo%20AIS.pdf> [retrieved on Jun. 6, 2006].

Universal Mobile Telecommunications System (UMTS); User Equipment (UE) radio transmission and reception (FDD) (3GPP TS 25.101 version 7.10.0 Release 7); ETSI TS 125 101, ETSI Standards, LIS, Sophia Antipolis Cedex, France, vol. 3-R4, No. V7.10.0, Jan. 1, 2008, XP014040597, ISSN: 0000-0001, figures A.2, A.3, A.6, A.7, A.8A.

International Search Report and Written Opinion—PCT/US2010/030595- International Search Authority, European Patent Office, Jun. 29, 2010.

Murali R Chari et al: "FLO Physical Layer. An Overview". IEEE Transactions on Broadcasting, IEEE Service Center, Piscataway, NJ, US LNKD-DOI: 10.1109/TBC.2007.891696, vol. 53, No. 1, Mar. 1, 2007, pp. 145-160, XP011172013, ISSN: 0018-9316.

"Forward Link Only Air Interface Specification for Terrestrial Mobile Multimedia Multicast; TIA-1099" EIA/TIA Standards, Telecommunications Industry Associations, Arlington, VA, US, Aug. 1, 2006, XP017005609.

Todd K. Moon: "Error Correction Coding" Jun. 6, 2005, Wiley-Interscience, New Jersey, XP002586308, ISBN: 9780471648000, pp. 618-618.

Taiwan Search Report—TW099111309—TIPO—Jan. 3, 2013.

3GPP, "3rd Generation Partnership Project; Technical Specification Group Radio Access Network; Multiplexing and channel coding (FDD) (Release 7)", 3GPP Standard; 3GPP TS 25.212, 3RD Generation Partnership Project (3GPP), Mobile Competence Centre ; 650, Route Des Lucioles ; F-06921 Sophia-Antipolis Cedex ; France, No. V7.7.0, Nov. 1, 2007, pp. 1-98, XP050366769.

* cited by examiner

APPARATUS AND METHODS FOR INTERLEAVING IN A FORWARD LINK ONLY SYSTEM

RELATED APPLICATIONS

This application claims the benefit of priority to U.S. Provisional Application No. 61/168,596 entitled "Apparatus and Methods for Interleaving in a Forward Link Only System" filed Apr. 11, 2009, the entire contents of which are hereby incorporated by reference.

BACKGROUND

MediaFLO® and Forward Link Only (FLO) is a digital wireless technology that has been developed by an industry-led group of wireless providers. The MediaFLO® technology was designed in one case for a mobile multimedia environment and exhibits performance characteristics suited for use on cellular handsets. It uses advances in coding and interleaving to achieve high-quality reception, both for real-time content streaming and other data services. MediaFLO® technology can provide robust mobile performance and high capacity without compromising power consumption. The technology also reduces the network cost of delivering multimedia content by dramatically decreasing the number of transmitters needed to be deployed. In addition, MediaFLO® technology-based multimedia multicasting complements wireless operators' cellular network data and voice services, delivering content to the same cellular handsets used on 3G networks.

It happens that when a signal is broadcast, it can propagate to a receiver by more than one path. For example, a signal from a single transmitter can propagate along a straight line to a receiver, and it can also be reflected off of physical objects to propagate along a different path to the receiver. Moreover, it happens that when a system uses a so-called "cellular" broadcasting technique to increase spectral efficiency, a signal intended for a receiver might be broadcast by more than one transmitter. Hence, the same signal will be transmitted to the receiver along more than one path. Such parallel propagation of signals, whether man-made (i.e., caused by broadcasting the same signal from more than one transmitter) or natural (i.e., caused by echoes) is referred to as "multipath". It can be readily appreciated that while cellular digital broadcasting is spectrally efficient, provisions must be made to effectively address multipath considerations.

Fortunately, modulation techniques such as Quadrature Amplitude Modulation (QAM) in Orthogonal Frequency Division Multiplexed (OFDM) systems, which include MediaFLO® systems, are more effective in the presence of multipath conditions than are similar modulation techniques in which only a single carrier frequency is used. More particularly, in single carrier QAM systems, a complex equalizer must be used to equalize channels that have echoes as strong as the primary path, and such equalization is difficult to execute. In contrast, in OFDM systems the need for complex equalizers can be eliminated altogether simply by inserting a guard interval of appropriate length at the beginning of each symbol. Accordingly, OFDM systems that use QAM modulation are preferred when multipath conditions are expected.

A data stream to be transmitted is encoded with a convolutional or turbo encoder and interleaved, and then successive bits are combined in a bit group that will become a QAM symbol. Several bits are in a group, with the number of bits per group typically ranging from four to seven, although groups may include more or less bits.

Interleaving of the data before bits are grouped into multi-bit symbols helps to ensure that consecutive bits of the input data stream will not land on the same QAM symbol, which could cause an error in decoding of that symbol that could result in a burst of bit-errors. By "interleaving" it is meant that the data stream is rearranged in sequence, to thereby randomize potential errors caused by channel degradation. To illustrate, suppose five words are to be transmitted, and during transmission of a non-interleaved signal, a temporary channel disturbance occurs. Under these circumstances, an entire word can be lost before the channel disturbance abates, and it can be difficult if not impossible to know what information had been conveyed by the lost word.

In contrast, if the letters of the five words are sequentially rearranged (i.e., "interleaved") prior to transmission and a channel disturbance occurs, several letters might be lost, perhaps one letter per word. Upon decoding the rearranged letters, however, all five words would appear, albeit with several of the words missing letters. It will be readily appreciated that, under these circumstances, it would be relatively easy for a digital decoder to recover the data substantially in its entirety. After interleaving the m-ary symbols, the symbols are mapped to complex symbols using QAM principles, multiplexed into their respective sub-carrier channels, and transmitted.

Recent developments in MediaFLO® system communications have sought to employ turbo encoders which encode each physical layer packet (PLP) separately. Additionally, developments seek to employ long turbo encoders with time diversity enhancements and for improved performance in fading channels. These evolutions to the MediaFLO® system are sometimes referred to as FLO-EV. Disclosure of long turbo encoders and encoding methods are disclosed in U.S. patent application Ser. No. 12/165,663, entitled "Wireless Communication of Turbo Coded Data with Time Diversity" filed Jul. 1, 2008 and published on Oct. 29, 2009 as U.S. Patent Publication No. 2009/0268694, the contents of which are hereby incorporated by reference in their entirety. However, use of long turbo codes with known encoder/interleavers has exhibited performance degradation issues. For example, the use of long turbo coders with conventional interleaving techniques have resulted in the biasing to particular packets or frames within an OFDM superframe. Accordingly, a need exists for interleaving in a FLO system that does not introduce biases and affords better performance with long turbo codes.

SUMMARY

The various embodiments provide methods and devices for encoding and interleaving data packets for transmission in a broadcast communication system. The various embodiments may utilize a plurality of long turbo encoders to encode a codeblock and an M-sequence intra-codeblock interleaver configured to interleave bits within at least one encoded long turbo code packet from the turbo encoder in a superframe. In an embodiment, only a single codeblock of turbo-encoded information is produced, eliminating the need for inter-codeblock interleaving. Some embodiments use an inter-codeblock interleaver.

In embodiment, the inter-codeblock interleaver uses a large M-Sequence eliminating the need for an intra-codeblock interleaver since an intra-codeblock interleaver would not provide any additional randomization.

Additional embodiments de-interleave and decode data packets received by a receiver device in a broadcast communication system using M-sequence de-interleavers and decoders which correspond to the encoders and interleavers used in the transmission of the received data signals.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
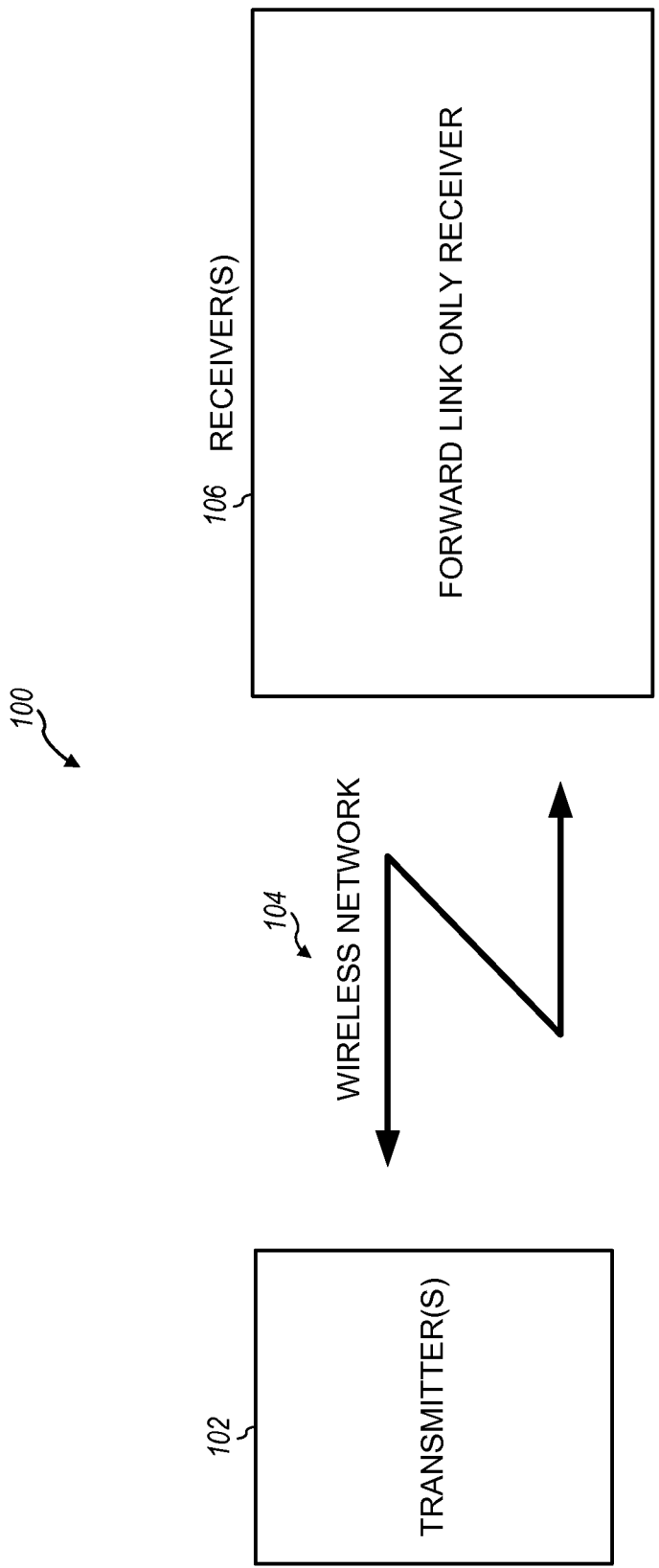
FIG. 1 is a block diagram illustrating a wireless network system for forward link only networks.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

As used herein, the terms "mobile device" and "handheld device" refer to any one or all of cellular telephones, personal data assistants (PDA's), palm-top computers, wireless electronic mail receivers (e.g., the Blackberry® and Treo® devices), multimedia Internet enabled cellular telephones (e.g., the Blackberry Storm®), Global Positioning System (GPS) receivers, wireless gaming controllers, and similar personal electronic devices which include a programmable processor and memory and receiver circuitry for receiving and processing mobile broadcast television services.

The various embodiments disclosed herein relate to apparatus and methods for interleaving that are particularly useful for the broadcast technologies and interference conditions experienced in a number of mobile multimedia broadcast systems. A multimedia mobile broadcast system technology to which the embodiments are particularly relevant is the MediaFLO-EV evolution system, which uses long turbo coding that encodes over all Physical Layer Packets (PLPs) comprising a code block. For this reason, the various embodiments are described using the terminology, characteristics and structures of MediaFLO as an illustrative example. However, the embodiments may also be applicable to other broadcast systems that use long turbo coding encompassing relatively long superframes, an example of which would be the broadcast systems using the Advanced Television Systems Committee mobile/handheld (ATSC M/H) standard protocol modified to perform long turbo coding over M/H frames (which include five M/H sub-frames). By smearing a data stream randomly and more or less equally over the duration of a long superframe, the embodiments avoid the problems of conventional encoding system that can cause a burst of data concentrated within a narrow time interval, rendering the transmissions susceptible to high error rates in the presence of some interference conditions.

The various disclosed embodiments optimize performance and implementability and ensure that no biases are introduced by the use of long turbo encoding methods. Conventional interleaving techniques applied to symbols encoding using a long turbo code have been found to result in a bias. Typically, data transmitted in a MediaFLO® communication system is sent in one-second frames. Each of the frames is divided into four subframes. When conventional interleaving techniques are implemented in a FLO communication system using long turbo codes, the performance of the system may vary depending upon which subframe is lost in transmission. For example, if the first or fourth subframe is lost, the system may require more time to reconstruct the lost data symbols than if the second or third subframe is lost. Since the performance of the system is dependent upon which subframe is lost in transmission, a bias may develop which can result in uneven degradation of the communication system, depending on the frame affected.

The disclosed embodiment methods and apparatus provide for interleaving of MediaFLO FLO data signals, including intra-codeblock bit interleaving, inter-codeblock bit interleaving, intra-interlace symbol interleaving, and inter-interlace symbol interleaving using M-sequence bit interleaving to mitigate any introduced bias.

The descriptions of the embodiments describe interleaving of data streams in a FLO-EV evolution of the MediaFLO standard. However, the embodiment methods and apparatus may be used in other communication systems, such as DVB. In a MediaFLO FLO-EV communication system, Long Turbo Coding (LTC) may be implemented to encode over all 16 Physical Layer Packets (PLPs) comprising a codeblock. After turbo encoding, various levels of interleaving are performed which differ from existing MediaFLO standard (TIA-1099). The disclosed embodiments improve performance and address asymmetry in terms of resilience to frame erasure.

FIG. 1 is a system block diagram illustrating a wireless network system 100 typical of broadcast networks in general, and of a MediaFLO® network in particular. The wireless network system 100 includes one or more transmitters 102 that broadcast data (e.g., multimedia data) across a wireless network 104 to one or more receivers 106. The receivers 106 can include substantially any type of communicating device such as a MediaFLO® receiver device, cell phone, computer, personal assistant, hand held or laptop devices, and so forth.

Portions of the receiver 106 are employed to decode transmitted signals and other data such as multimedia data.

Figure 2:
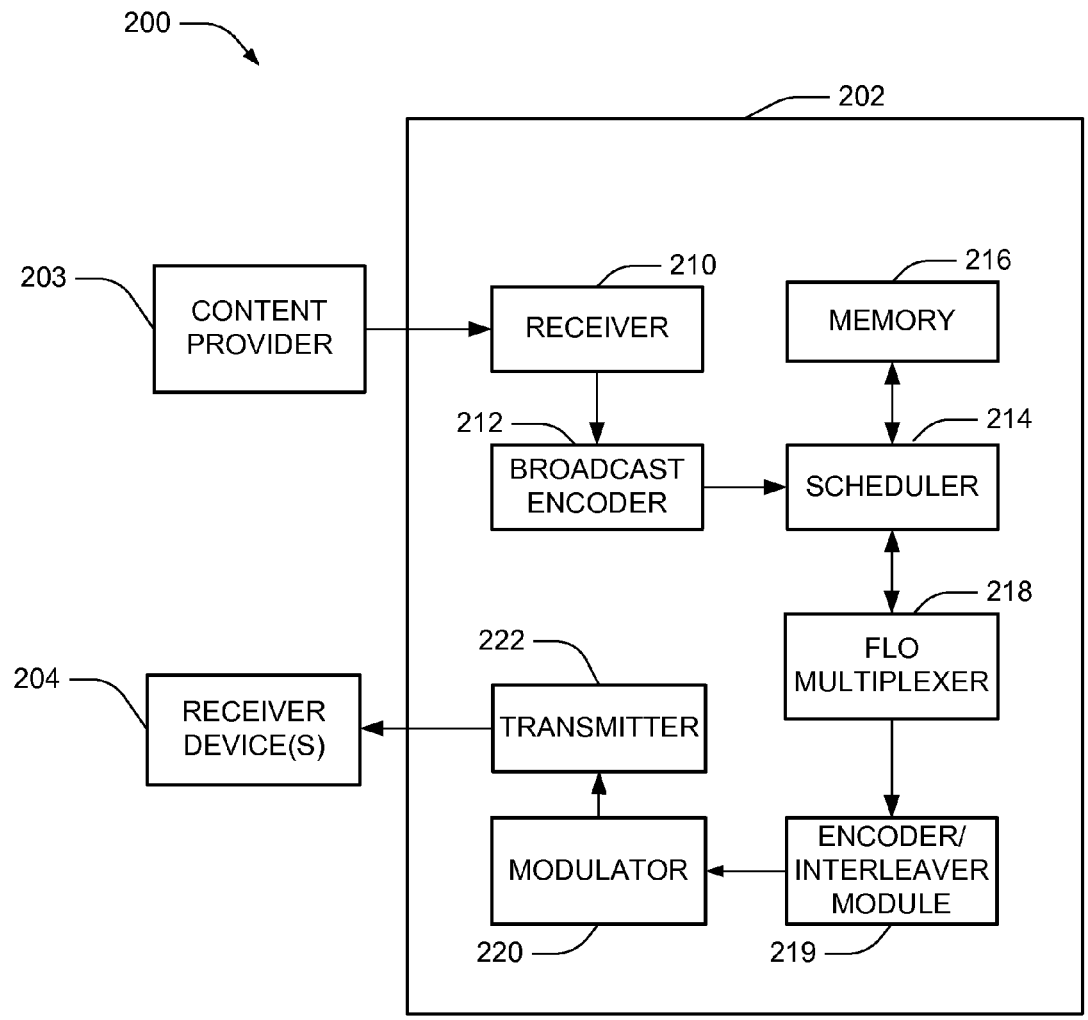
FIG. 2 is a block diagram illustrating an exemplary base station for a MediaFLO wireless system.

FIG. 2 is a component block diagram illustrating a MediaFLO® communication system 200 that includes a FLO broadcast system 202, at least one content provider 203, and at least one receiver device 204. The FLO broadcast system 202 may receive audio and/or video content from one or more content providers 203 via a receiver server 210. Receiver server 210 can receive information via the Internet and pass the data to a broadcast encoder server 212 that converts the received multi-media content into a format compatible with FLO broadcast transmissions. FLO-encoded data packets may be selected for broadcast by a scheduler server 214 which is coupled to a memory 216 for storing content for its broadcast time.

To broadcast FLO content, video content stored in memory 216 or received from the broadcast encoder server 212 is selected and retrieved by the scheduler server 214 to a FLO multiplexer server 218. The FLO multiplexer server 218 multiplexes a plurality of content flows into a single FLO multiplex signal by allocating content data symbol streams to a specific MediaFLO Logical Channel (MLCs) for transmission in the FLO broadcast signal. Before broadcast, the content data symbol streams are processed by an encoder/interleaver module 219 that processes the data symbol streams to render them robust to interference and fading by turbo encoding and interleaving the data packets. The encoder/interleaver module 219 may turbo encode the data symbol stream, and the encoded data symbol stream may then be interleaved. By interleaving the data stream, the encoder/interleaver module 219 sequentially re-arranges the data symbol stream to provide another level of error correction and protection from signal interference. Embodiment methods implemented within the encoder/interleaver module 219 are described in more detail below.

A modulator 220 can modulate the encoded and interleaved signals into a single multiplexed wireless signal for transmission by a transmitter 222 through a transmit antenna (not shown) to receiver devices 204. In a FLO broadcast system, multiple broadcast transmitters within a coverage area broadcast the same signal approximately simultaneously. This enables receiver devices 204 to receive the broadcast multi-media content from any location within the coverage area even while moving about. To enable this, multiple modulators 220 and transmitters 222 are used in a broadcast coverage area.

Figure 3:
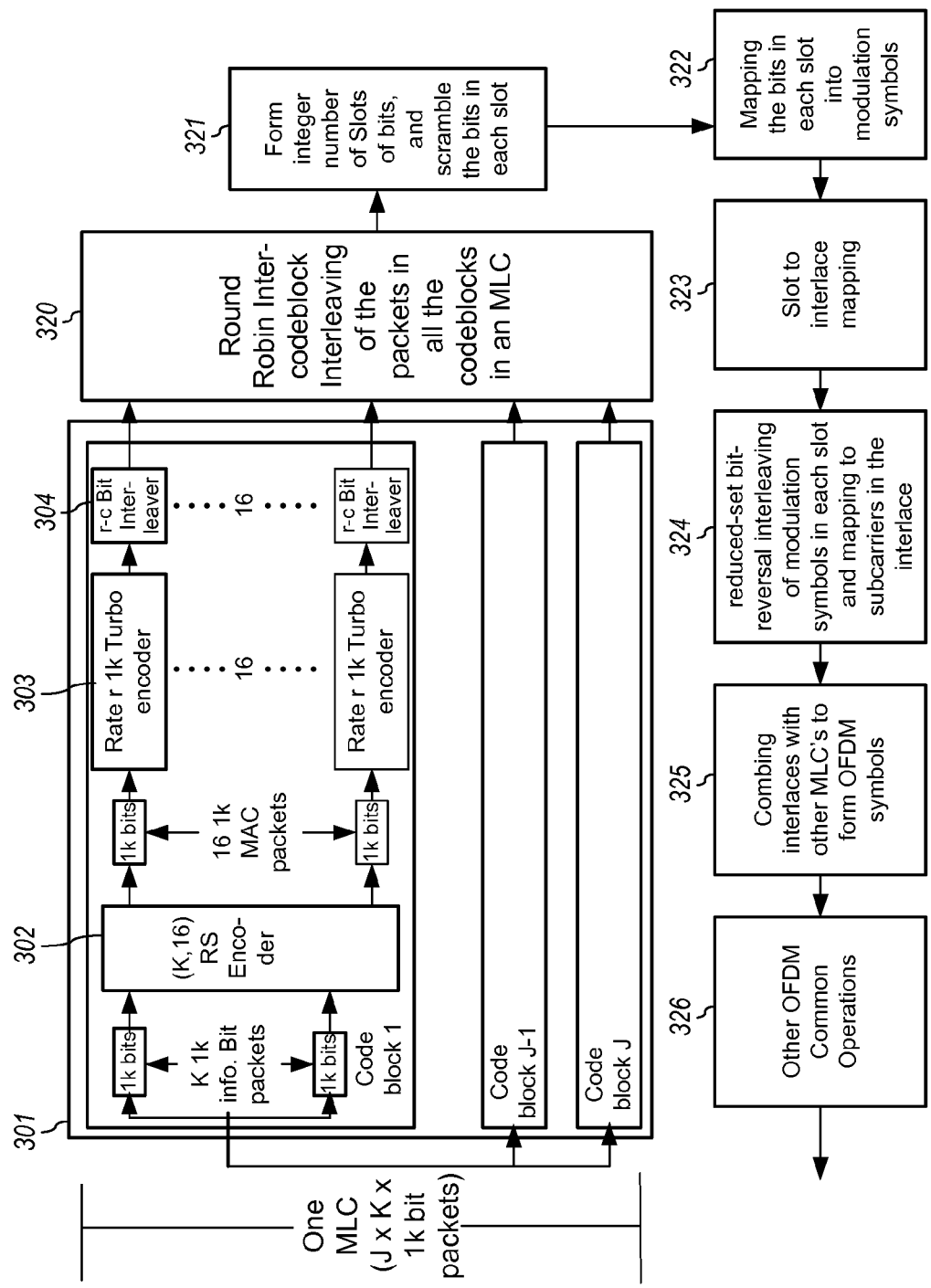
FIG. 3 is a block diagram illustrating a conventional interleaver structure for MediaFLO.

FIG. 3 is a component and process flow diagram illustrating a conventional method for encoding and interleaving data in module 219 according to the TIA-1099A standard for MediaFLO. In TIA-1099A the data associated with a MediaFLO Logical Channel (MLC) 301 for any particular superframe consists of J codeblocks, each containing K information packets. For each codeblock within the MLC, information packets may be Reed-Solomon encoded in encoder module 302 using a (K,16) code, and the 16 packets that comprise the output of the Reed-Solomon encoding step 302 may be individually encoded with turbo encoder using rate R, step 303. The input packets are 1 Kbits long. Therefore the resulting packets at the output of the turbo encoder are 1K/R in length.

Each of the individual encoded packets in the encoding and interleaving module 219 of FIG. 3 is bit-interleaved using a row-column (r-c) interleaver module 304. The output packets of this operation may be combined with the packets belonging to the other codeblocks and interleaved in a Round-Robin fashion via Round-robin inter-codeblock interleaver, step 320. The round-robin fashion interleaving process involves taking the first packet of the first codeblock, followed by the first packet of the second codeblock etc., until the first packet of the J-th codeblock is reached. At that point the operation continues with the second packet of the first codeblock and so on, until all 16 packets of all J codeblocks have been interleaved.

The encoder/interleaver module 219 may then form an integer number of slots of bits and scramble the output bits of the round-robin inter-codeblock interleaver in each formed slot in step 321. The output bits of the scramble operation may be mapped to slots consisting of 1000 or 2000 bits for QPSK and 16 QAM modulation of the MLC, respectively, in step 322. The bits in each slot may also be mapped to 500 modulation symbols per slot. The slots may then be mapped to interlaces using a slot-to-interlace map in step 323.

The modulation symbols may be interleaved within the interlace using a reduced-set bit-reversal interleaver and mapped to the subcarriers in the interlace, step 324. The interlaces may be combined to form OFDM symbols, step 325. Subsequent OFDM common operations may be performed on the formed OFDM symbols in step 326 before the symbols are modulated in modulator 220 for transmission. In the original MediaFLO technology, each physical layer packet (PLP) is turbo encoded separately, and thus no bias was introduced. However, the implementation of this encoding and interleaving structure in a broadcast system employing Long Turbo Code (LTC), as in the FLO-EV technology, may result in a bias that variably degrades the communication system performance depending upon which transmitted subframe is not properly received by the receiver devices 204.

To overcome the limitations of previous encoding technology with long turbo codes, the various embodiments encode data packets to generate pseudo random noise sequence of bits. By rendering the data pseudo random, the potential for bias is minimized. The embodiments utilize the M-sequence encoder method that is typically used for encrypting data, and not for protecting data from interference and fading.

Figure 4:
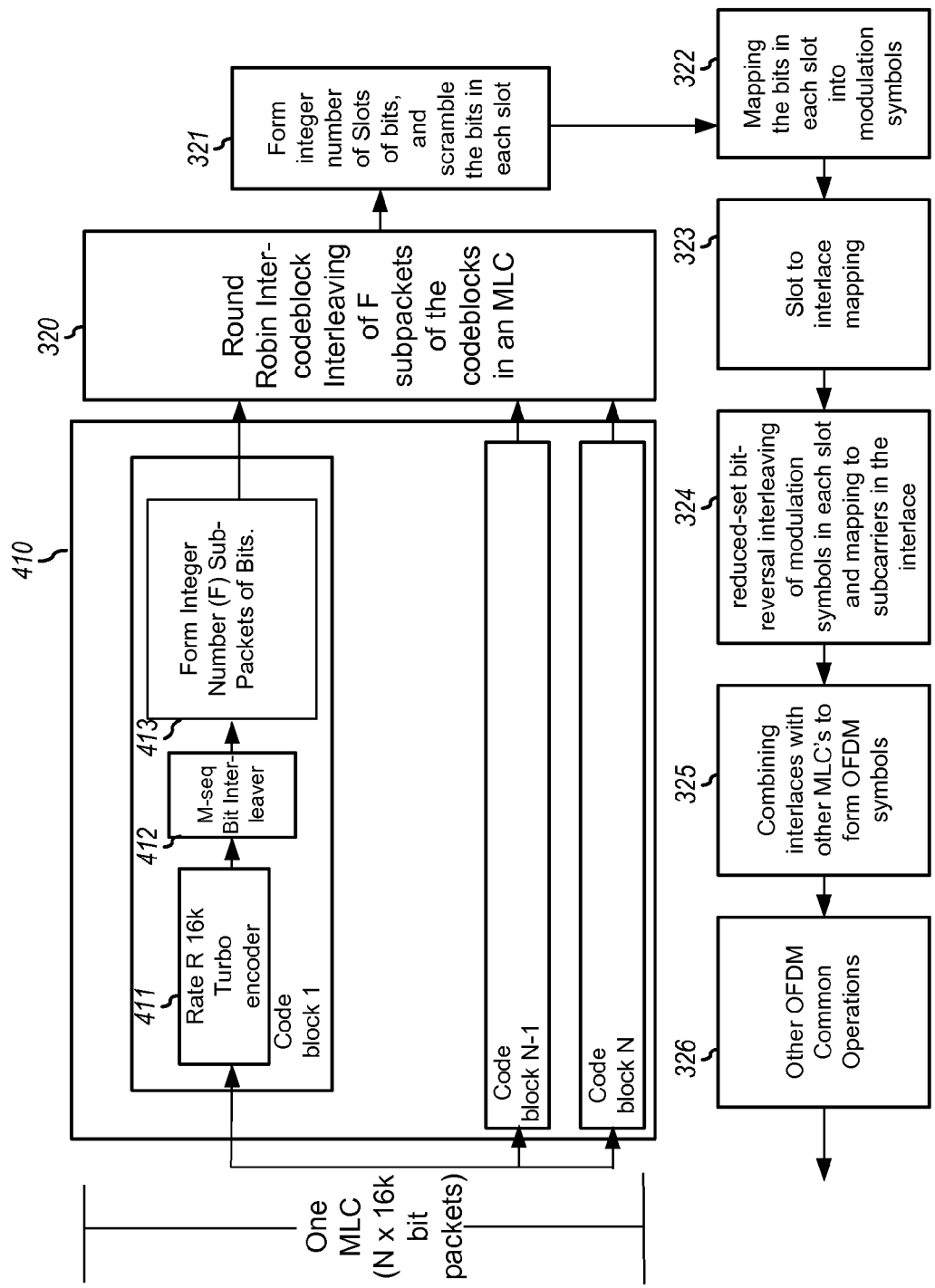
FIG. 4 is a flow diagram illustrating an embodiment method for encoding/interleaving data for the MediaFLO FLO-EV.

FIG. 4 illustrates an embodiment encoding/interleaving method for the MediaFLO FLO-EV. Instead of encoding input bits with a Reed-Solomon encoder and then individually turbo encoding the bits as described above in conventional TIA-1099A standard, the embodiment encoder/interleaver module 219 concatenates the 16 input packets and encodes the entire concatenated codeblock 410 using a Long Turbo Encoder (LTC) in step 411.

Figure 5A:
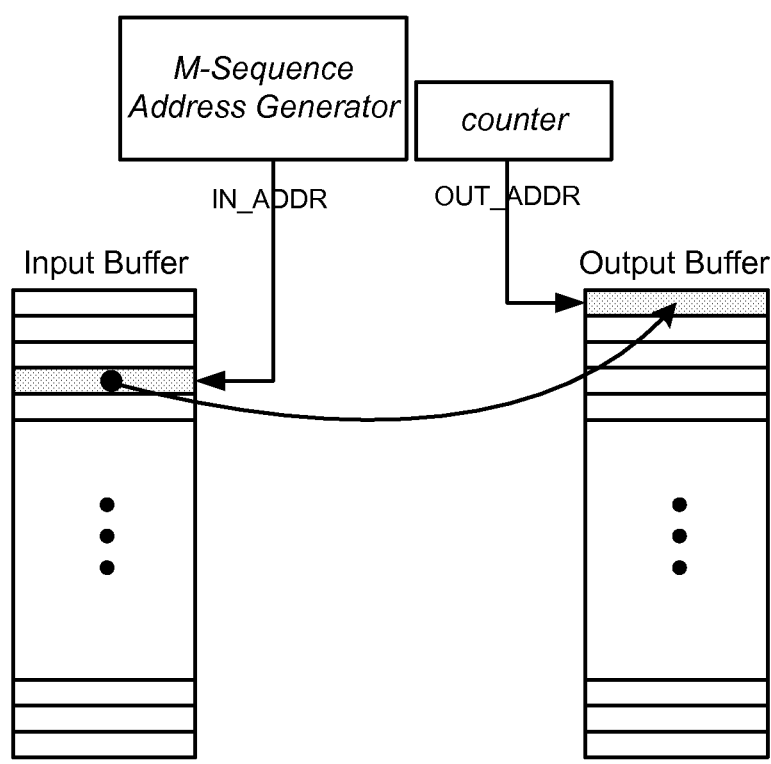
FIG. 5A is an illustration of the operation of an M-Sequence interleaving process.

Once the entire codeblock has been turbo encoded, an intra-codeblock M-sequence bit-interleaving operation is performed on the turbo encoded codeblock in step 412. The M-sequence bit interleaver generates a maximum length pseudo random noise sequence in a shift register at each clock pulse cycle. The generated pseudo random noise sequence may be interpreted as an address location in the input buffer. As such, all of the input bits for a particular codeblock need to be received before the operation can commence. In the M-sequence bit interleave process, an M-Sequence generator is used in the encoder/interleaver process to generate address locations to denote bit-indices in the input buffer from which a bit is recalled to add to the bit string for each individual codeblock stored in the output buffer memory. At the next clock pulse a new memory address location is generated by the pseudo random noise generator. This process is illustrated in FIG. 5A. In addition, the next turbo encoded bit of the codeblock is obtained from the input buffer by the M-sequence bit interleaver 412 using the new generated pseudo random noise sequence address location and stored to the output buffer using a simple incrementing counter to generate the address in that memory. This process may continue until $2^M-1$ address locations are generated. In this manner the turbo encoded bits of the codeblock may be randomly re-ordered and shuffled. When used for encrypting data, this process results in a near random sequence of bits that cannot be processed to recognize patterns. In the embodiments, the M-sequence bit interleaver process is used to shuffle information words in the signal stream in a pseudo random fashion before being mapped to modulation symbols to render a signal that is robust against fading.

The encoded and bit-interleaved packet may then be subdivided into an integer number of equal-sized subpackets, step 413. At this point each codeblock consists of F subpackets of size 16K/(F*R) where R is the code rate. When F is chosen to be equal to 16, the operation of the old and new inter-codeblock interleaver become identical, but in the various embodiments a larger value of F is used. As a result of using a larger number of subpackets, each subpacket will be smaller in terms of absolute number of bits than the packets handled by the inter-codeblock interleaver in conventional TIA-1099A techniques. In an example embodiment F is to set the value of F=80.

One of skill in the art may appreciate that minor modifications of the embodiment methods are possible. For instance instead of dividing the encoded packet into F subpackets each of a length that depends on the code rate R, the encoded packet can also be divided into fixed-length packets of some length L that is independent of the code rate. In that case there will be floor (16K/R*L) of packets of length L, with possibly some left-over bits. Any left-over bits are treated like a final subpacket of length<L.

The process of turbo encoding, M-sequence bit interleaving and forming subpackets is accomplished in parallel in a plurality N of encoder/interleaver modules to generate a plurality N of intra codeblock interleaved bit streams which are round robin interleaved in step 320. Thus, the plurality of encoder/interleaver modules include a plurality of long turbo encoders, a plurality of M-sequence bit interleavers, and a plurality of subpacket formers. The plurality of encoder/interleaver modules generate a plurality of turbo encoded codeblocks, each of which are interleaved using the M-sequence bit interleaving scheme to generate a plurality of M-sequence bit interleaved bits sequences that are formed into a plurality of subpackets.

Once these encoded and interleaved bits are arranged into integer number (F) sub-packets of bits, step 413, the codeblock sub-packets are ready for processing using conventional interleaving processes of steps 320-326 described above with respect to FIG. 3. The Round-Robin interleaver, step 320, used in the embodiment encoder/interleaver module may be identical in structure to the one present in IS-1099A, except that it operates on subpackets of the 16K turbo encoder output, instead of whole packets of the 1K turbo encoder.

The embodiment encoder/interleaver module of FIG. 4 solves performance problems that arise in long turbo code systems using a conventional encoder/interleaver module design as shown in FIG. 3. The design of FIG. 4 also resolves an asymmetry that can arise with respect to frame erasure if the conventional r-c interleaving is used in long turbo coded designs. Using the conventional design of FIG. 3 to process long turbo coded superframes may result in performance degradation from the erasure of an entire frame depending on which of the 4 frames in a MediaFLO superframe is erased, such as due to fading. This difference in performance degradation is referred to as a bias. The design of FIG. 4 is not sensitive to such bias since the content data is distributed throughout the frames in a pseudo random manner. It should be appreciated, however, that the performance degradation issue in long turbo coding system addressed by the embodiments is not present in conventional MediaFLO® systems in which each packet is individually turbo coded.

The structure of the embodiment illustrated in FIG. 4 implements a transmission chain that is different from the conventional structure of FIG. 3; that is steps 411-413 replace steps 302-304, respectively. Also, the embodiments also eliminate the Reed-Solomon encoder. The data associated with an MLC consists of N codeblocks each containing a single 16K information packet. The packet is turbo-encoded using a 16K long turbo encoder of rate R in step 411. The output packet of this operation is of length 16K/R. This entire packet is then bit-interleaved all at once using a reduced-set M-sequence generator-based interleaver in step 412.

In various embodiments other information packet sizes can be used, such as 4K and 8 Kbits. Also different types of interleavers can be used, in place of the M-Sequence interleaver in step 412, or the Round-Robin interleaver in step 320. One such alternative embodiment is discussed below with reference to FIG. 6.

Thus, in contrast to the codeblock 301 of the conventional encoder/interleaver design shown in FIG. 3, the embodiment encoder/interleaver turbo encodes the entire codeblock of data bits and interleaves those encoded bits using an M-Sequence bit interleaver in step 412.

One of skill in the art may appreciate that minor modifications of the embodiment methods are possible. For instance for small enough F (or large enough L), full frequency diversity can be exploited even without the step of interleaving of modulation symbols within the interlace. This step can optionally be skipped in such embodiments.

In a preferred embodiment the bit-interleaver 412 used to interleave the bits in each code block may be configured as a reduced-set M-Sequence interleaver. This type of interleaver is based on an M-Sequence generator which can be used to generate bit-indices that denote the next bit to be added to the interleaved sequence. The M-sequence generator may include a Linear Feedback Shift Register (LFSR) of some length M. The register length is chosen so that the LFSR has a sufficiently large state space to cover the largest encoded packet that it will be handling. The size S of the packet to be interleaved is 16K/R where R is the turbo code rate. For example, a code rate of 1/3 results in an encoded packet of 48K bits. A 16-bit LFSR has $2^{16}-1=65535$ states and would cover an encoded packet of this size.

Figure 5B:
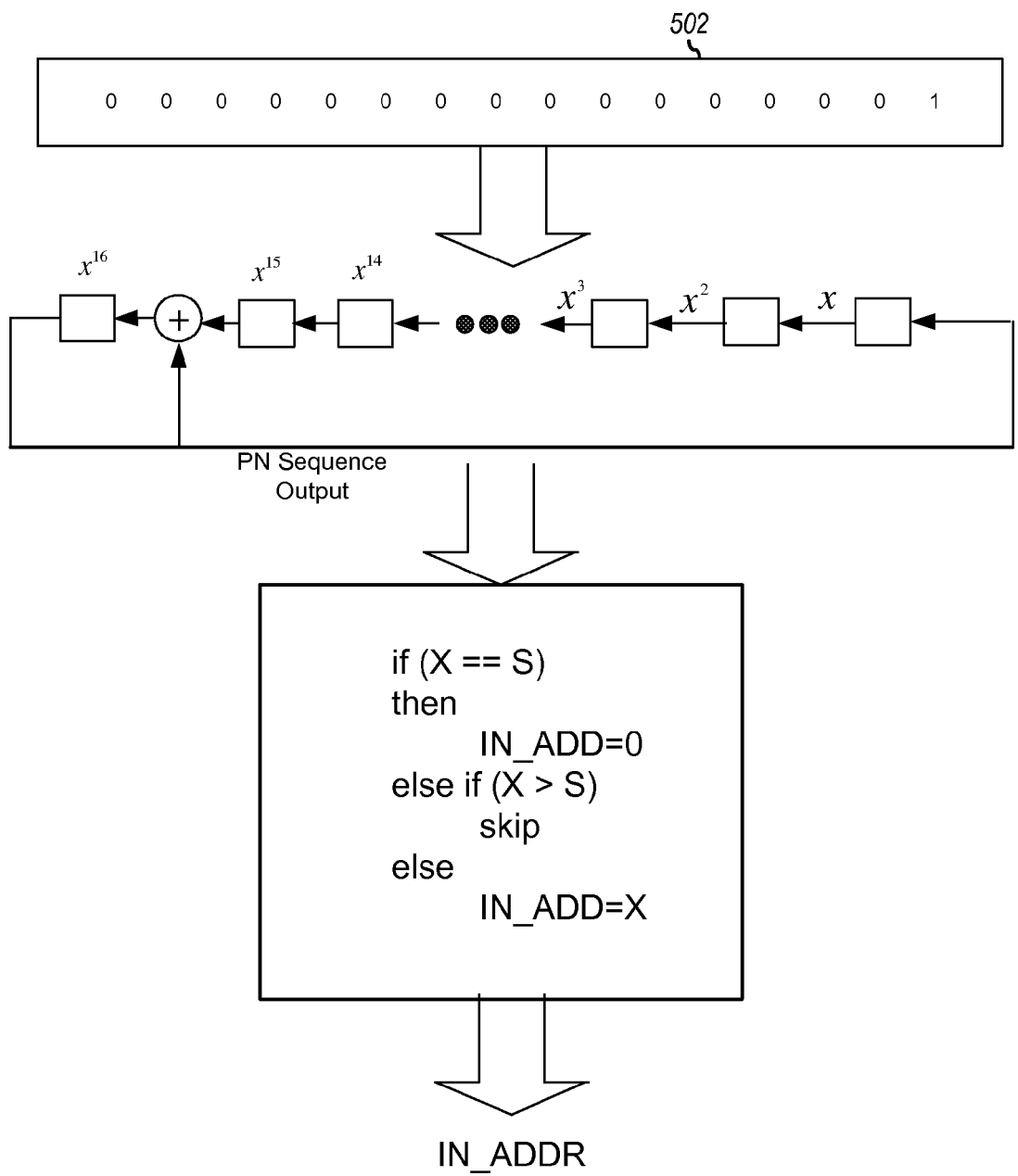
FIG. 5B shows an exemplary 16-bit LFSR to generate the M-Sequence that may be used with an M-Sequence interleaver 408 in FIG. 4.

FIG. 5 shows an exemplary 16-bit LFSR to generate the M-Sequence that may be used for M-Sequence interleaver in step 412. Before interleaving begins, a register 502 is loaded with the value of 0x1. The register is then clocked once. The value X of the register bits together is then compared to the interleaver length S. If X is smaller than S, the value of X is copied to the output of the circuit. If X is equal to S, a value of 0 is output. If X is larger than S, this value of X is skipped and the register is clocked again. This process is repeated until a value of X in the target range of [1, ... , S] is reached.

Each value of the input buffer address IN_ADDR that is generated this way is used as an index into the packet to be interleaved. The output buffer address OUT_ADDR is initialized to a value of 0. The value of the bit addressed by IN_ADDR is copied to address OUT_ADDR in the output buffer of the interleaver. The value of OUT_ADDR is then incremented by 1. The process now repeats to produce the next bit of the output buffer. This way the output buffer is written sequentially. Once the last bit of the output buffer at OUT_ADDR equal to S–1 is written, the process is complete. The algorithm guarantees in this case that each bit of the input packet has been copied to the output buffer exactly once.

The process of using an M-Sequence generator to interleave an encoded turbo packet automatically works for all code rates R, regardless of the size S of the output packet. Any state values of the internal LFSR that exceed the target interleaver size S are skipped or "punctured" and this ensures that the interleaving finishes correctly. Note that for turbo code rates that result in relatively small output packets, this can mean that a large number of values of X needs to be skipped before the next value in the target range [1, . . . , S] is reached.

While this generally is not a problem, there are alternative embodiments possible which might be desirable if the apparatus would otherwise run out of clock cycles to complete the operation. In this alternative embodiment, different versions of the algorithm are incorporated with different length LFSRs. The appropriate version of the algorithm can then be picked depending on the code rate of the turbo code that is used. For instance, for a code rate 1/3 a 16-bit LFSR is needed. For code rate 2/3, the output of the turbo encoder is 24K bits long and in that case a 15-bit LFSR would suffice to cover the required number of states.

Figure 6:
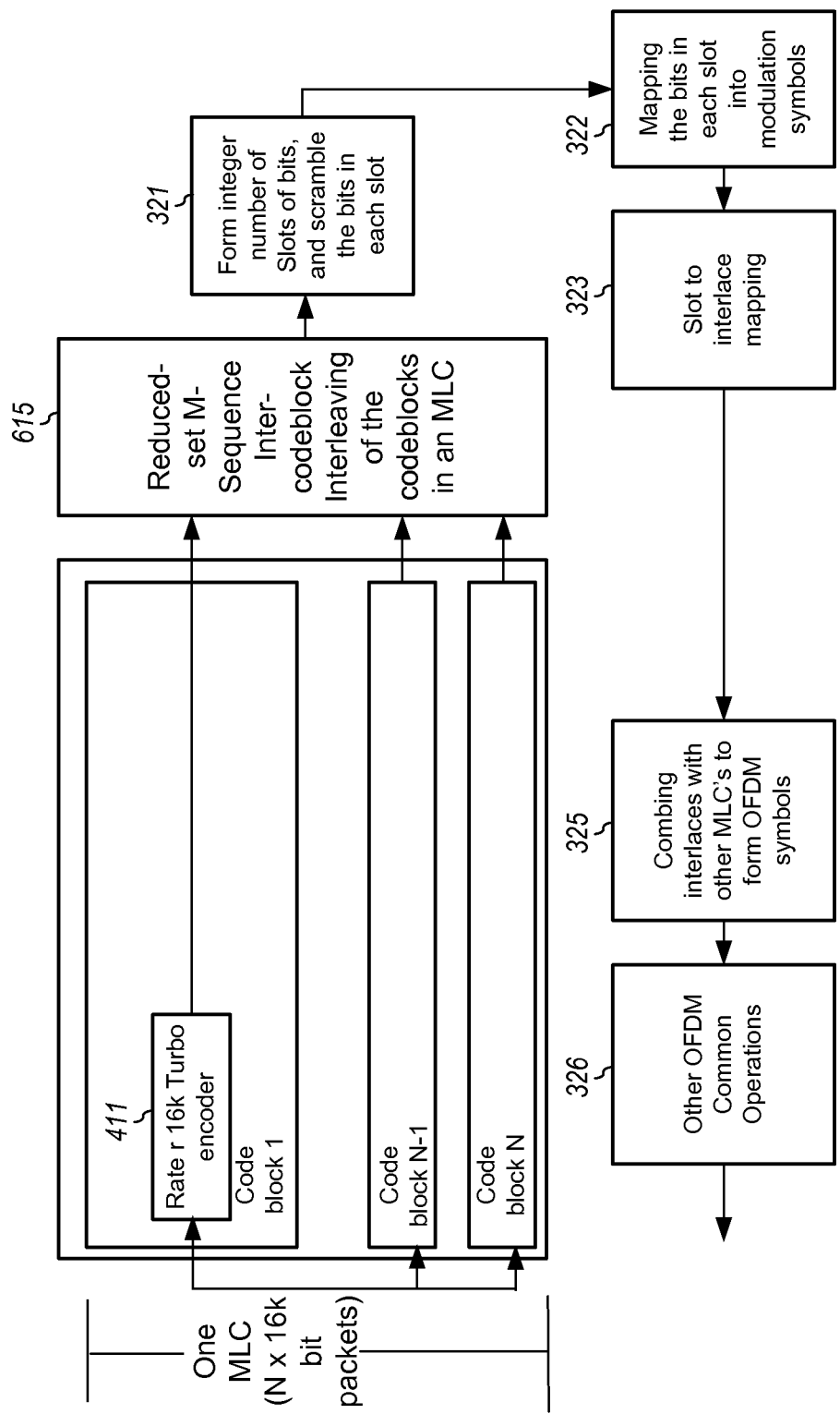
FIG. 6 is a flow diagram illustrating an alternative embodiment method for encoding/interleaving data for the MediaFLO FLO-EV.

FIG. 6 illustrates an alternative embodiment encoding/interleaving method that may be utilized with FLO communication systems, such as FLO-EV. Although this embodiment encoding/interleaving method may add complexity to the implementing structure, it affords slightly improved performance compared to the design of the embodiment illustrated in FIG. 4, and thus may be preferable in some implementations. In particular, the MLC encoder of FIG. 6 includes N code blocks as in FIG. 4, each consisting of a single 16 Kbits long information packet. Similar to the embodiment shown in FIG. 4, a turbo encoder is used in step 411 to turbo encode the packet to form an output packet of length 16K/R where R is the turbo coderate used for the MLC.

However, in contrast to the embodiment shown in FIG. 4, in the embodiment shown in FIG. 6 there is no intra-codeblock bit-interleaver, such as the M-Sequence bit interleaver in step 412 of FIG. 4. In addition, in the embodiment shown in FIG. 6, the output packet is no longer partitioned into subpackets in step 413 of FIG. 4. Instead the bits associated with the turbo encoded packets of all N codeblocks are concatenated together to form a single superpacket of size (16K*N)/R. This superpacket is then bit-interleaved all at once using a reduced-set M-Sequence interleaver in step 615. The design of this M-sequence interleaver 615 is similar to the M-Sequence bit interleaver utilized in step 412 and described above with respect to FIG. 4, except that the LFSR covers the increased size of the superpacket. In an embodiment, this LFSR could use a 27-bit shift register, based on filling an entire MediaFLO superframe with a single MLC using a transmission mode of 16QAM, turbo rate 2/3.

Once the turbo encoded superpacket is bit-interleaved, the resulting encoded and interleaved bits may be processed using the same or similar steps 320-326 described above with reference to FIGS. 3 and 4. As shown in FIG. 6, in contrast to the processes shown in FIGS. 3 and 4, once the slots are mapped to interlaces using a slot-to-interlace map in step 323, the modulation symbols may not be interleaved within the interlace using a reduced-set bit-reversal interleaver in step 324 and mapped to the subcarriers in the interlace. Since the turbo encoded bits are interleaved after a superpacket is formed, that interleaving process essentially interleaves the bits within the interlace in step 615 and, therefore, such an additional interleaving operation is not required.

The embodiment of FIG. 6 affords slightly improved performance in fading channels over the embodiment described above with reference to FIG. 4, as well as obviating the need for interleaving of modulation symbols within each interlace because full frequency diversity is always exploited. On the other hand, the embodiment shown in FIG. 6 increases implementational complexity. Because the number of bits in the superpacket likely exceeds what can be stored on a processor chip, an external memory will be required to store the packet prior to and after interleaving. The interleaving operation itself will then involve single-bit read and write operations on this memory resulting in inefficient use of the memory bus. Additionally the difference between the shortest and longest interleaver required in this design is very large, meaning that either a very large number of interleaver states will have to be punctured or, alternatively, that a significant number of different versions of the interleaver circuit will have to be present in order to avoid excessive puncturing.

Figure 7:
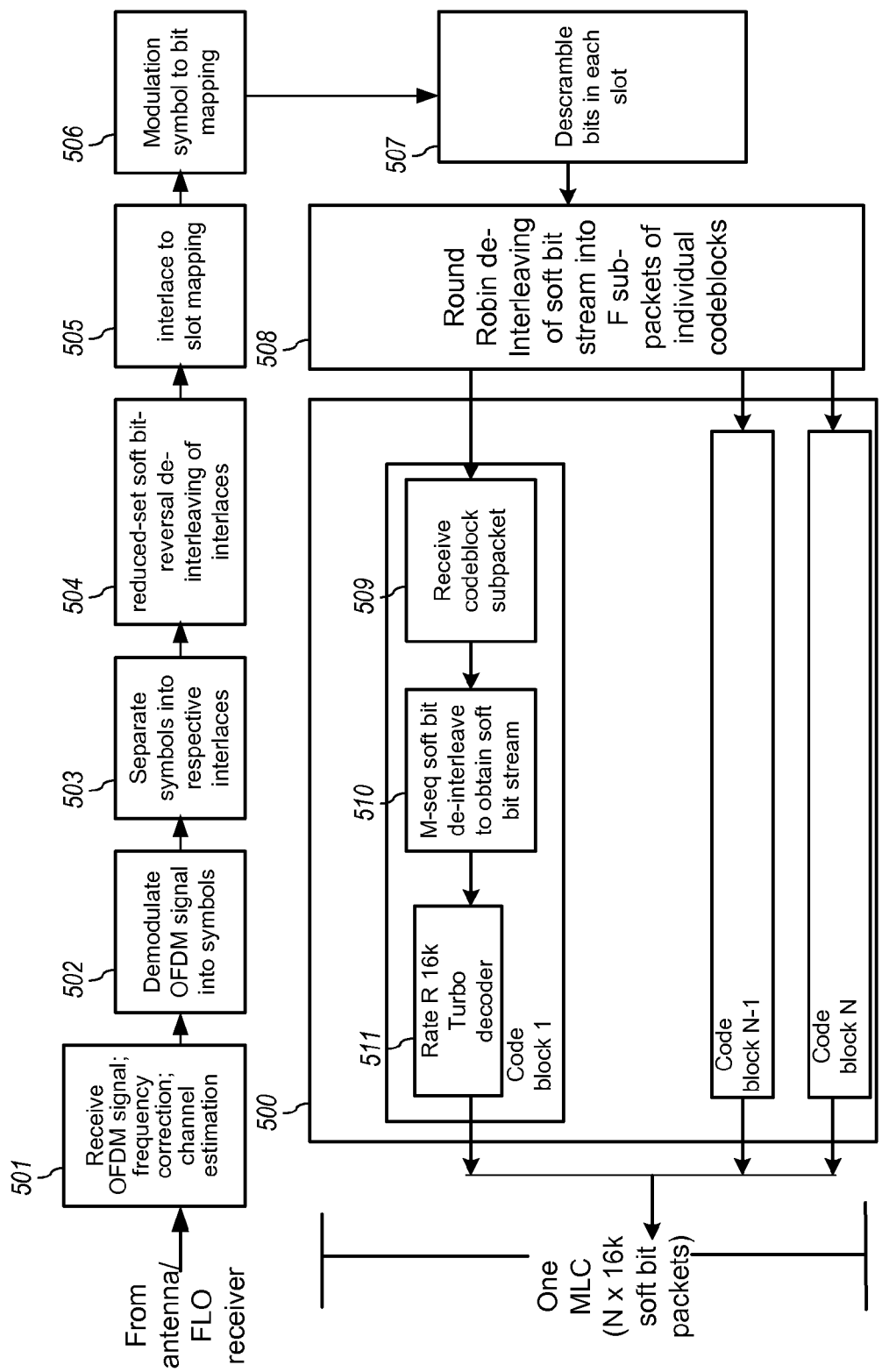
FIG. 7 is a flow diagram illustrating an embodiment method for decoding/de-interleaving data for the MediaFLO FLO-EV.

In the receiver devices the inverse of the processes described above are performed in order to recover the original data packets. FIG. 7 illustrates an embodiment method that may be implemented in a receiver device for decoding/de-interleaving data packets received from a base station implementing the embodiment encoding/interleaving method described above with reference to FIG. 4. The embodiment method for decoding/de-interleaving data packets may be performed by a dedicated receiver circuit or the processor within a receiver device. The OFDM signal may be received via an antenna in a FLO receiver circuit which accomplishes frequency correction and channel estimation in step 501. The received OFDM signal may be demodulated into the respective symbols in step 502. Once demodulated, the symbols may be separated into their respective interlaces in step 503. The interlaces may be de-interleaved using a reduced set soft bit reversal process in step 504. The de-interleaved interlaces may be mapped to their appropriate slots using an interlace to slot map in step 505. The modulation symbols may be mapped into their appropriate soft bit strings in step 506. The soft bit strings may be descrambled into each respective slot in step 507. In the receiver, "soft bits" or "soft information" are processed. The soft information corresponding to a particular bit represents the likelihood that the bit is a 0 or a 1 (for instance all negative values mean the bit is more likely to be a 1 while all positive values of the soft information mean the bit is more likely to be a 0). The magnitude of the soft information represents the confidence in the particular value.

The resulting bitstream may then be de-interleaved using a round robin de-interleaver in step 508, in which the de-interleaver operates in an inverse manner to that described above with reference to FIG. 4 in order to recover the separate codeblock subpackets. The round robin de-interleaver recovers separate codeblock subpacket streams by allocating the first subpacket to the last codeblock, etc., until a sub-packet allocated to the first codeblock is reached. At that point the de-interleaving operation continues with the second packet of the last codeblock and so on, until all 16 packets of all N codeblocks have been de-interleaved. In each codeblock the subpackets are recovered in step 509.

Figure 9:
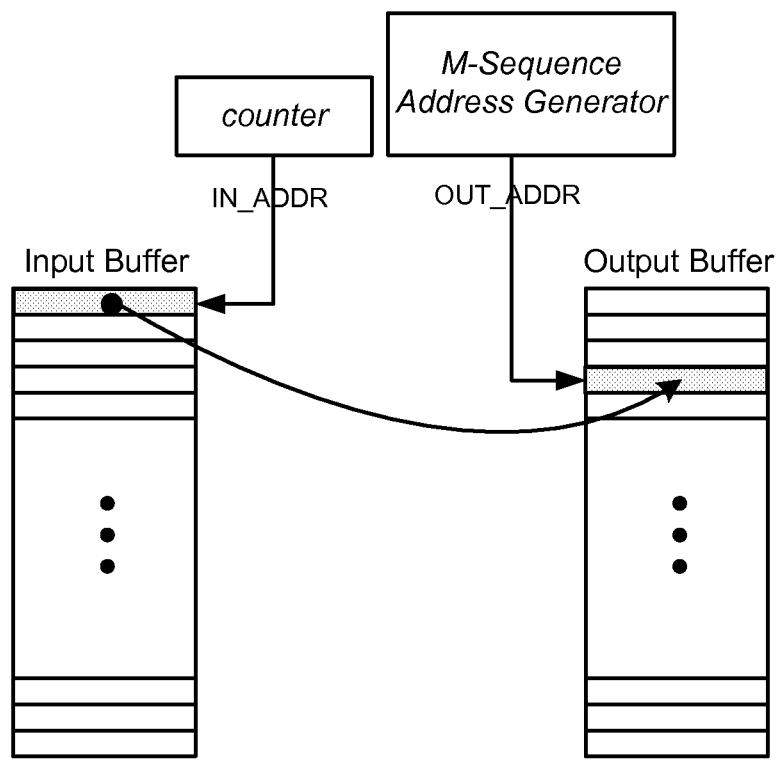
FIG. 9 is an illustration of the operation of an M-Sequence de-interleaving process.

The recovered subpackets are subjected to an M-sequence bit de-interleaving process to obtain a bit stream, step 510. In the M-sequence bit de-interleave process, as each turbo encoded bit of the codeblock is received by the M-sequence bit de-interleaver the encoded soft bit is stored to the generated pseudo random noise sequence address location in a manner that recovers the original turbo encoded data packets (i.e., the data packets that were subjected to the M-sequence bit interleaving in step 412 as described above with reference to FIG. 4). This process is illustrated in FIG. 9. This process is similar to how data streams encrypted using M-sequence bit interleaving encryption are decrypted. As soft bits are recovered they are allocated to the appropriate codeblock in order to recover the original turbo encoded codeblocks. Once an entire codeblock is recovered, the codeblocks are subjected to a turbo decoding process in step 511 to recover the original codeblock (i.e., the codeblock prior to turbo encoding in step 411 as described above with reference to FIG. 4). The process of de-interleaving through the M-sequence bit interleaver process and turbo decoding may be performed in parallel in a plurality N of decoder modules 1-N within the deinterleaver/decryptor module 500 to yield a plurality N of original codeblocks. The recovered plurality of decoded and de-interleaved codeblocks may be combined to recreate the MLC data flow which is provided to a processor to enable reception of a content flow.

A process of recovering bits or frames of data lost due to interference or fading may be performed after symbols have been recovered but before the data is recovered. In this manner, the error detection and correction processing will act on pseudo randomly interleaved data which helps to ensure the error correction process behaves consistently during fading events (i.e., avoids biased performance).

Figure 8:
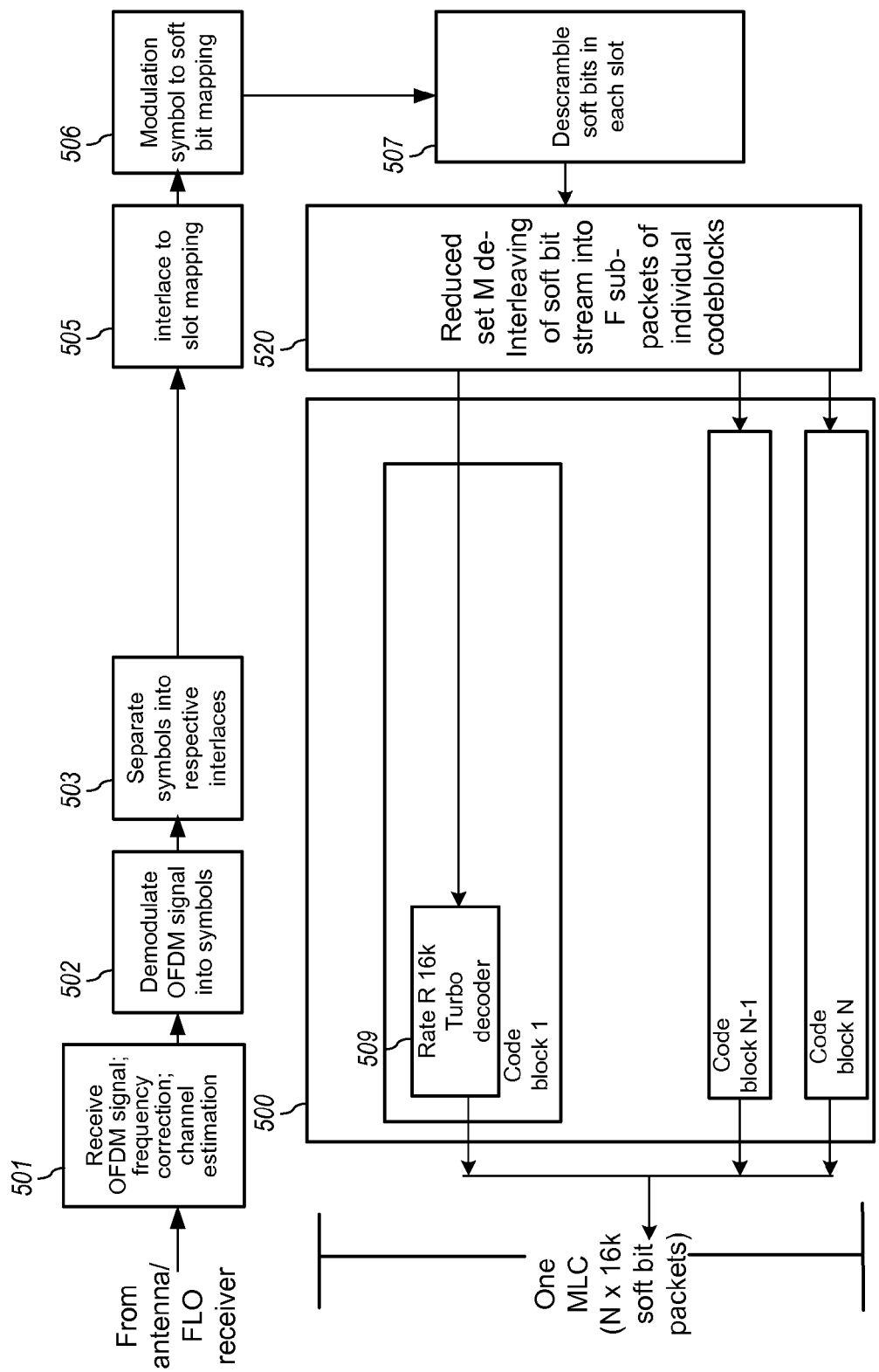
FIG. 8 is a flow diagram illustrating an alternative embodiment method for decoding/de-interleaving data for the MediaFLO FLO-EV.

FIG. 8 illustrates an embodiment method that may be implemented in a receiver device for decoding/de-interleaving data packets received from a base station implementing the embodiment encoding/interleaving method described above with reference to FIG. 6. The alternative embodiment method illustrated in FIG. 8 implements operations that are substantially similar to those in the embodiment method illustrated in FIG. 7. However, the data packets are encoded and interleaved in the embodiment method shown in FIG. 6 using a reduced set M-sequence interleaver in step 615. As a result, on the receiver device side the received data only has to be subjected to a single reduced-set M-sequence bit reversal de-interleaving process in step 520. Thus, the reduced set bit reversal process of step 504 and the M-sequence bit de-interleaving process in step 510 are not necessary. Instead, the reduced set M de-interleaving process in step 520 recovers a plurality N of turbo encoded codeblocks which are each subjected to an turbo decoding process in step 509 to recover the original plurality N of data packets. Thus, in this embodiment the decoder module 500 includes a plurality N of turbo decoders 509. The recovered plurality of data packets are then combined to recover the data flow of the MLC.

As discussed above with respect to FIG. 6, the decoding/de-interleaving process illustrated in FIG. 8 affords slightly improved performance in fading channels over the design described with reference to FIG. 7, as well as obviating the need for de-interleaving interlaces into respective modulation symbols. However, the implementation of the embodiment method of FIG. 8 may suffer a number of disadvantages as described above with reference to FIG. 6. For example, the implementation of the decoding/de-interleaving process of FIG. 8 may increase the complexity of the hardware within the receiver device. Because the number of bits in the superpacket likely exceeds what can be stored on chip, an external memory will be required to store the packet prior to and after de-interleaving. The de-interleaving operation itself will then involve single-bit read and write operations on this memory which may result in inefficient use of the memory bus.

As discussed above, the various embodiments may also be useful and applicable to any broadcast technology utilizing long turbo coding on superframes comprised of multiple subframes, an example of which would be ATSC M/H protocol transmission if long turbo coding were implemented. Therefore, references to MediaFLO® technology and the use of MediaFLO® terminology is intended to serve as an example embodiment, and not to limit the scope of the claims unless specifically recited.

The various embodiment methods for decoding and de-interleaving received FLO/DVB-H signals may be performed by the multimedia receiver 606 and portions of the processor 601 and memory 602. Alternatively dedicated modules within or coupled to the multimedia receiver 606 may perform the embodiment methods. In other alternative embodiments, the methods may be performed by the processor 601 after the FLO/DVB-H signal is received and demodulated by the multimedia receiver 606.

Figure 10:
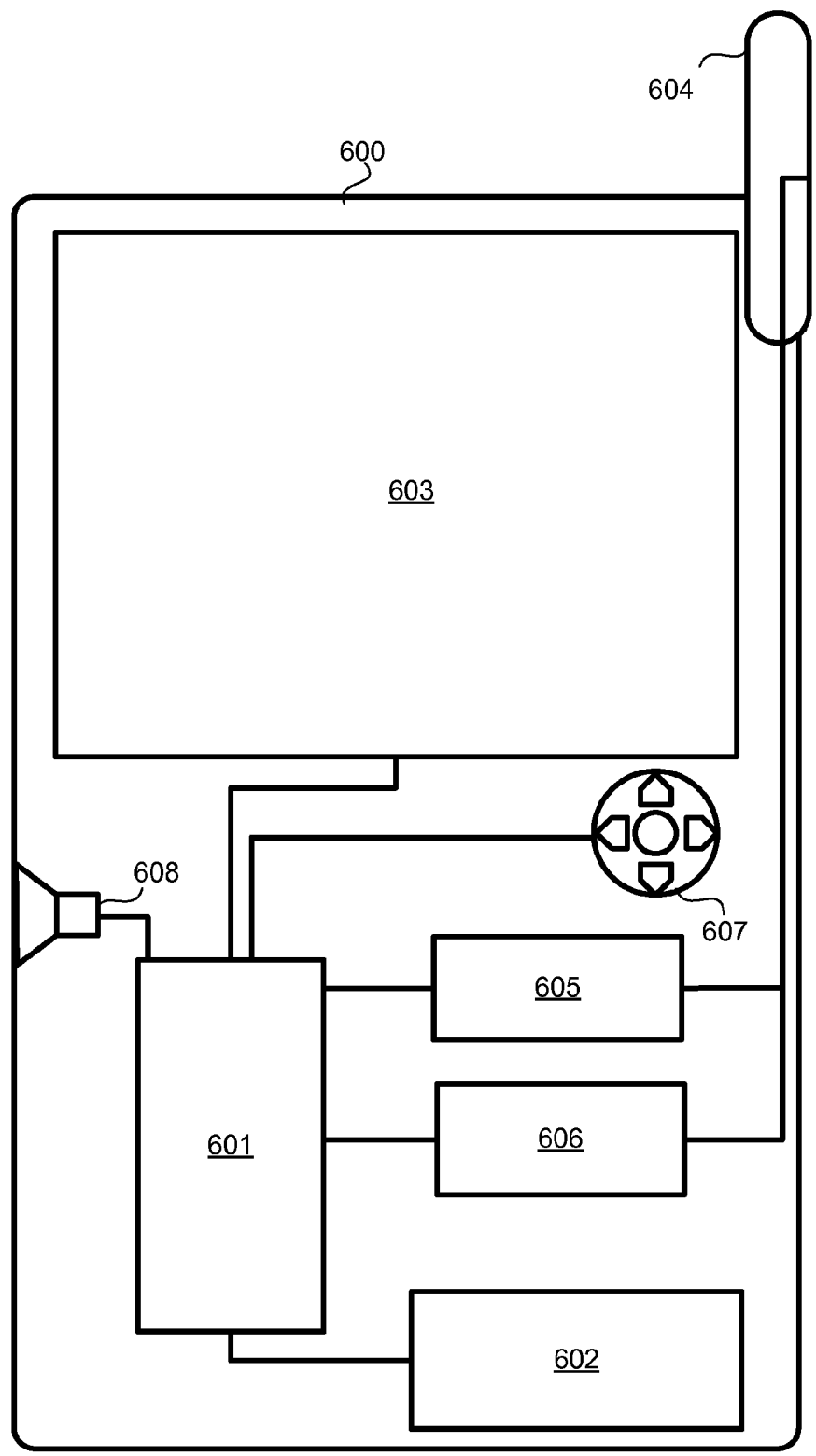
FIG. 10 is a system block diagram of a receiver device suitable for use in an embodiment.

FIG. 10 is a system block diagram of a receiver device suitable for receiving data encoded and interleaved in accordance with any of the embodiments. A typical receiver device 600 may include a processor 601 coupled to internal memory 602, a display 603, and to a speaker 608. Additionally, the receiver device 600 will include an antenna 604 for sending and receiving electromagnetic radiation that may be connected to a wireless data link and/or cellular telephone transceiver 605 coupled to the processor 601 and a mobile multimedia broadcast receiver 606 coupled to the processor 601. Receiver devices 600 typically also include menu selection buttons or rocker switches 607 for receiving user inputs.

Figure 11:
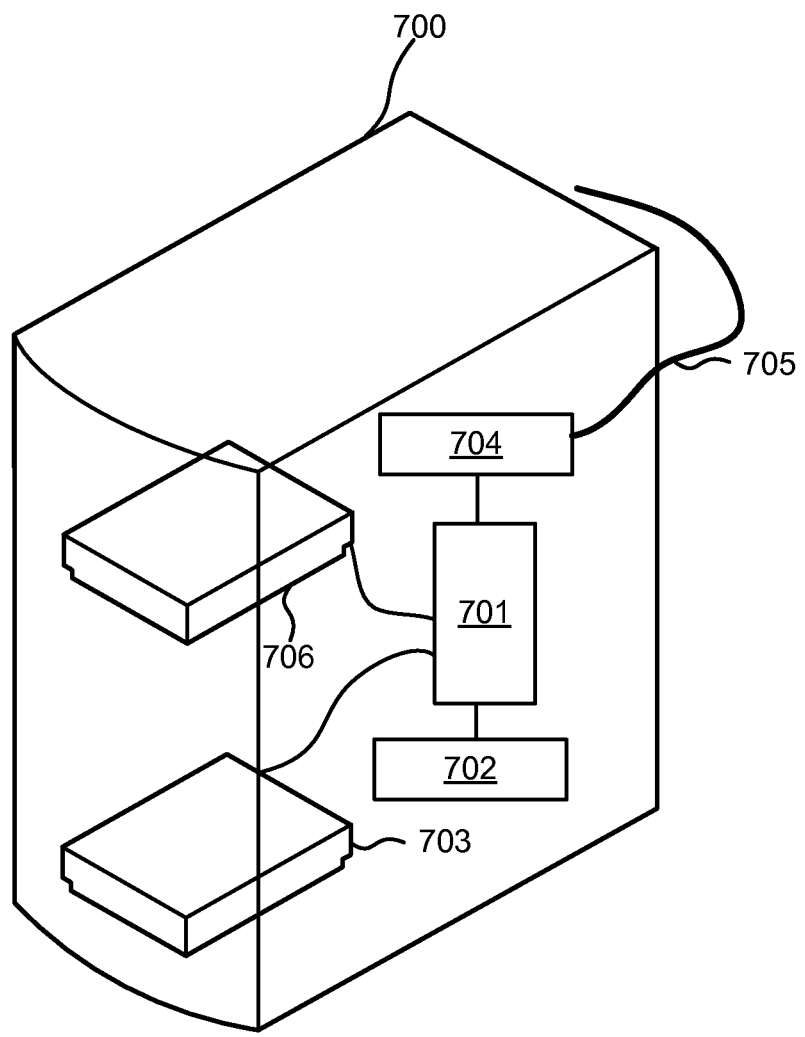
FIG. 11 is a system block diagram of a server suitable for use in an embodiment.

The various embodiments on the broadcast side described above may be implemented on any of a variety of commercially available server devices, such as the server 700 illustrated in FIG. 11. Such a server 700 typically includes a processor 701 coupled to volatile memory 702 and a large capacity nonvolatile memory, such as a disk drive 703. The server 700 may also include a floppy disc drive, compact disc (CD) or DVD disc drive 706 coupled to the processor 701. The server 700 may also include network access ports 704 coupled to the processor 701 for establishing data connections with a network 705, such as a local area network coupled to a FLO scheduler server 214 or a broadcast modulator 220.

The processors 601, 701 may be any programmable microprocessor, microcomputer or multiple processor chip or chips that can be configured by software instructions (applications) to perform a variety of functions, including the functions of the various embodiments described below. In some mobile receiver devices, multiple processors 701 may be provided, such as one processor dedicated to wireless communication functions and one processor dedicated to running other applications. Typically, software applications may be stored in the internal memory 602, 702, 703 before they are accessed and loaded into the processor 601, 701. The processor 601, 701 may include internal memory sufficient to store the application software instructions.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in a non-transitory processor-readable storage medium, such as a RAM memory, flash memory, ROM memory, EPROM memory, EEPROM memory, registers, hard disk, a removable disk, a CD-ROM, or any other form of storage medium known in the art. An exemplary non-transitory processor-readable storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the non-transitory processor-readable storage medium may reside as discrete components in a user terminal. By way of example, and not limitation, non-transitory processor-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of non-transitory processor-readable media. Additionally, the operations of a method or algorithm may reside as one or any combination or set of codes and/or instructions on a tangible, non-transitory processor-readable medium and/or computer-readable medium, which may be incorporated into a computer program product.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of transmitting a plurality of codeblocks in a communication system, the method comprising:
    turbo encoding a plurality of codeblocks using a plurality of long turbo encoders to generate a plurality of turbo encoded codeblocks;
    interleaving each of the plurality of turbo encoded codeblocks using an M-sequence bit interleaving scheme;
    transmitting the plurality of turbo encoded and M-sequence bit interleaved codeblocks;
    wherein the M-sequence bit interleaving scheme comprises:
        pseudo-randomly generating a maximum length M-sequence state in a linear feedback shift register;
        utilizing the linear feedback shift register internal state as a memory location address in a buffer;
        obtaining a bit of at least one of the plurality of turbo encoded codeblocks stored in an input buffer at the M-sequence state memory address; and
        storing the obtained bit in a next available memory location address in an output buffer.

2. The method of claim 1, wherein interleaving the plurality of turbo encoded codeblocks using the M-sequence bit interleaving scheme is performed on an intra-codeblock basis to form a plurality of intra codeblock interleaved bit streams.

3. The method of claim 2, further comprising:
    forming an integer number subpackets of bits from each of the plurality of intra codeblock interleaved bit streams; and
    interleaving the formed subpackets from each of the plurality of intra codeblock interleaved bit streams in an inter-codeblock fashion using a round-robin interleaving scheme.

4. The method of claim 1, wherein interleaving the turbo encoded codeblock using the M-sequence bit interleaving scheme is performed on an inter-codeblock basis.

5. An apparatus for use in a broadcast communication system, comprising:
    means for turbo encoding a plurality of codeblocks using a plurality of long turbo encoders to generate a plurality of turbo encoded codeblocks;
    means for interleaving each of the plurality of turbo encoded codeblocks using an M-sequence bit interleaving scheme; and
    means for transmitting the plurality of turbo encoded and M-sequence bit interleaved codeblocks;
    wherein the means for interleaving each of the plurality of turbo encoded codeblocks using an M-sequence bit interleaving scheme comprises:
        means for pseudo-randomly generating a maximum length M-sequence state in a linear feedback shift register;
        means for utilizing the linear feedback shift register internal state as a memory location address in a buffer; and
        means for storing a next available bit of at least one of the plurality of turbo encoded codeblocks to the memory location address in the buffer.

6. The apparatus of claim 5, wherein means for interleaving the plurality of turbo encoded codeblocks using the M-sequence bit interleaving scheme comprises means for interleaving the plurality of turbo encoded codeblocks using the M-sequence bit interleaving scheme on an intra-codeblock basis to form a plurality of intra-codeblock interleaved bit streams.

7. The apparatus of claim 6, further comprising:
means for forming an integer number subpackets of bits from each of the plurality of intra-codeblock interleaved bit streams; and
means for interleaving the formed subpackets from each of the intra-codeblock interleaved bit streams in an inter-codeblock fashion using a round-robin interleaving scheme.

8. The apparatus of claim 5, wherein means for interleaving the turbo encoded codeblock using the M-sequence bit interleaving scheme comprises means for interleaving the turbo encoded codeblock using the M-sequence bit interleaving scheme on an inter-codeblock basis.

9. An apparatus for use in a broadcast communication system, comprising:
a memory buffer;
a processor coupled to the memory buffer, wherein the processor is configured with software instructions to perform steps comprising:
turbo encoding a plurality of codeblocks using a plurality of long turbo encoders to generate a plurality of turbo encoded codeblocks;
interleaving each of the plurality of turbo encoded codeblocks using an M-sequence bit interleaving scheme;
transmitting the plurality of turbo encoded and M-sequence bit interleaved codeblocks;
pseudo-randomly generating a maximum length M-sequence state in a linear feedback shift register;
utilizing the linear feedback shift register internal state as a memory location address in the memory buffer; and
storing a next available bit of at least one of the plurality of turbo encoded codeblocks to the memory location address in the buffer.

10. The apparatus of claim 9, wherein the processor is further configured with software instructions to perform steps further comprising:
interleaving the plurality of turbo encoded codeblocks using the M-sequence bit interleaving scheme on an intra-codeblock basis to form a plurality of intra-codeblock interleaved bit streams.

11. The apparatus of claim 10, wherein the processor is further configured with software instructions to perform steps further comprising:
forming an integer number subpackets of bits from each of the plurality of intra-codeblock interleaved bit streams; and
interleaving the formed subpackets from each of the intra-codeblock interleaved bit streams in an inter-codeblock fashion using a round-robin interleaving scheme.

12. The apparatus of claim 9, wherein the processor is further configured with software instructions to perform steps further comprising:
interleaving the turbo encoded codeblock using the M-sequence bit interleaving scheme on an inter-codeblock basis.

13. A non-transitory storage medium having stored thereon processor-executable software instructions configured to cause a processor in a broadcast communication system to perform steps comprising:
turbo encoding a plurality of codeblocks using a plurality of long turbo encoders to generate a plurality of turbo encoded codeblocks;
interleaving each of the plurality of turbo encoded codeblocks using an M-sequence bit interleaving scheme;
transmitting the plurality of turbo encoded and M-sequence bit interleaved codeblocks;
pseudo-randomly generating a maximum length M-sequence state in a linear feedback shift register;
utilizing the linear feedback shift register internal state as a memory location address in the memory buffer; and
storing a next available bit of at least one of the plurality of turbo encoded codeblocks to the memory location address in the buffer.

14. The non-transitory storage medium of claim 13, wherein the tangible storage medium has processor-executable software instructions configured to cause a processor in a broadcast communication system to perform further steps comprising:
interleaving the plurality of turbo encoded codeblocks using the M-sequence bit interleaving scheme on an intra-codeblock basis to form a plurality of intra-codeblock interleaved bit streams.

15. The non-transitory storage medium of claim 14, wherein the tangible storage medium has processor-executable software instructions configured to cause a processor in a broadcast communication system to perform further steps comprising:
forming an integer number subpackets of bits from each of the plurality of intra-codeblock interleaved bit streams; and
interleaving the formed subpackets from each of the intra-codeblock interleaved bit streams in an inter-codeblock fashion using a round-robin interleaving scheme.

16. The non-transitory storage medium of claim 13, wherein the tangible storage medium has processor-executable software instructions configured to cause a processor in a broadcast communication system to perform further steps comprising:
interleaving the turbo encoded codeblock using the M-sequence bit interleaving scheme on an inter-codeblock basis.

17. An apparatus for use in a broadcast communication system, comprising:
a plurality of long turbo encoders each configured to encode one of a plurality of codeblocks for transmission in a channel thereby generating a plurality of turbo encoded codeblocks;
at least one M-sequence interleaver configured to interleave each of the plurality of turbo encoded codeblocks;
a transmitter for transmitting the plurality of turbo encoded and m-sequence bit interleaved codeblocks;
an M-sequence pseudo-random sequence generator;
a maximum length linear feedback shift register for generating the M-sequence pseudo-random sequence;
a memory buffer;
a processor configured to interpret each member of the M-sequence pseudo-random sequence as a memory location address in the memory buffer and to store a next available bit of at least one of the plurality of turbo encoded codeblocks to the memory location address in the memory buffer.

18. The apparatus of claim 17, further comprising a plurality of M-sequence interleavers wherein each of the plurality of M-sequence interleavers is configured to interleave one of the plurality of turbo encoded codeblocks in an intra-codeblock basis.

19. The apparatus of claim 18, further comprising:
a plurality of subpacket forming modules, each configured to form an integer number subpackets of bits from the intra-codeblock interleaved bit stream; and
a round robin interleaver configured to interleave the formed subpackets from each of the plurality of subpackets forming modules across multiple frames of a group of frames by respectively placing subpackets of each of the plurality of long turbo encoded packets into different frames of the group of frames.

20. The apparatus of claim 17, wherein the at least one M-sequence interleaver is configured to interleave each of the turbo encoded codeblocks from each of the plurality of long turbo encoders across multiple frames of a group of frames by respectively placing subpackets of each of the plurality of long turbo encoded packets into different frames of the group of frames.

21. The apparatus of claim 20, wherein the at least one M-sequence interleaver is configured to concatenate all long turbo code encoded codeblocks received from the plurality of long turbo encoders for a the group of frames and to subsequently interleave the codeblocks in the group of frames.

22. A method of decoding and de-interleaving a received data signal in a receiver device, the method comprising:
  receiving a long turbo encoded and M-sequence interleaved data signal;
  de-interleaving the received data signal using a round-robin de-interleaver to generate a plurality of turbo encoded codeblocks;
  storing each of the plurality of turbo encoded codeblocks in a corresponding codeblock input buffer;
  pseudo-randomly generating an M-sequence state in a maximum length linear feedback shift register;
  using the M-sequence state as a memory location address in the codeblock input buffer; and
  storing a next available soft bit stored in the codeblock input buffer in a codeblock output buffer at a location corresponding the M-sequence bit memory location address.

23. A method of decoding and de-interleaving a received data signal in a communication system, the method comprising:
  receiving a long turbo encoded and M-sequence interleaved data signal;
  de-interleaving the received data signal using an M-sequence de-interleaver to generate a plurality of turbo encoded codeblocks; and
  decoding each of the plurality of codeblocks using a corresponding plurality of long turbo decoders;
  wherein de-interleaving the received data signal using the M-sequence bit de-interleaver comprises:
    storing received data signal in an input buffer;
    pseudo-randomly generating an M-sequence bit in a maximum length linear feedback shift register;
    utilizing the M-sequence bit as a memory location address in the input buffer; and
    storing a next available soft bit in the input buffer at a location in an output buffer corresponding to the M-sequence memory location address.

24. An apparatus for use in a communication receiver device, comprising:
  means for receiving a long turbo encoded and M-sequence interleaved data signal;
  means for de-interleaving the received data signal using a round-robin de-interleaver to generate a plurality of turbo encoded codeblocks;
  means for storing each of the plurality of turbo encoded codeblocks in a corresponding codeblock input buffer;
  means for pseudo-randomly generating an M-sequence state in a maximum length linear feedback shift register;
  means for using the M-sequence state as a memory location address in a codeblock input buffer; and
  means for storing a next available a soft bit stored in the codeblock input buffer in a codeblock output buffer at a location corresponding to the M-sequence memory location address.

25. An apparatus for use in a communication receiver device, comprising:
  means for receiving a long turbo encoded and M-sequence interleaved data signal;
  means for de-interleaving the received data signal using an M-sequence de-interleaver to generate a plurality of turbo encoded codeblocks; and
  means for decoding each of the plurality of codeblocks using a corresponding plurality of long turbo decoders;
  wherein the means for de-interleaving the received data signal using the M-sequence bit de-interleaver comprises:
    means for storing received data signal in an input buffer;
    means for reverse pseudo-randomly generating an M-sequence bit in a maximum length linear feedback shift register;
    means for utilizing the M-sequence bit as a memory location address in the input buffer;
    means for storing a next available soft the bit in the input buffer at a location in an output buffer corresponding to the M-sequence memory location address.

26. An apparatus for use in a communication receiver device, comprising:
  a memory; and
  a processor coupled to the memory, wherein the processor is configured with software instructions to perform steps comprising:
    receiving a long turbo encoded and M-sequence interleaved data signal;
    de-interleaving the received data signal using a round-robin de-interleaver scheme to generate a plurality of turbo encoded codeblocks;
    storing each of the plurality of turbo encoded codeblocks in a corresponding codeblock input buffer;
    reverse pseudo-randomly generating an M-sequence state in a maximum length linear feedback shift register;
    using the M-sequence state as a memory location address in the corresponding codeblock input buffer; and
    storing a next available soft bit stored in the corresponding codeblock input buffer in a codeblock output buffer at a location corresponding to the M-sequence memory location address.

27. An apparatus for use in a communication receiver device, comprising:
  a memory; and
  a processor coupled to the memory, wherein the processor is configured with software instructions to perform steps comprising:
    receiving a long turbo encoded and M-sequence interleaved data signal;
    de-interleaving the received data signal using an M-sequence de-interleaver scheme to generate a plurality of turbo encoded codeblocks;
    long turbo decoding each of the plurality of codeblocks;
    storing the received data signal in an input buffer;
    reverse pseudo-randomly generating an M-sequence bit in a maximum length linear feedback shift register;
    utilizing the M-sequence bit as a memory location address in the input buffer; and storing a next available soft bit in the input buffer at a location in an output buffer corresponding to the M-sequence memory location address.

28. A non-transitory processor-readable storage medium having stored thereon processor-executable software instructions configured to cause a mobile device processor to perform steps comprising:

receiving a long turbo encoded and M-sequence interleaved data signal;

de-interleaving the received data signal using a round-robin de-interleaver scheme to generate a plurality of turbo encoded codeblocks;

storing each of the plurality of turbo encoded codeblocks in a corresponding codeblock input buffer;

pseudo-randomly generating a maximum length M-sequence state in a linear feedback shift register;

using the M-sequence state as a memory location address in the codeblock input buffer; and storing a next available soft bit stored in the codeblock input buffer in a codeblock output buffer at a location corresponding to the M-sequence memory location address.

29. A non-transitory processor-readable storage medium having stored thereon processor-executable software instructions configured to cause a receiver device processor to perform steps comprising:

receiving a long turbo encoded and M-sequence interleaved data signal;

de-interleaving the received data signal using an M-sequence de-interleaver scheme to generate a plurality of turbo encoded codeblocks;

long turbo decoding each of the plurality of codeblocks;

storing the received data signal in an input buffer;

reverse pseudo-randomly generating an M-sequence bit in a maximum length linear feedback shift register;

utilizing the M-sequence bit as a memory location address in the input buffer; and storing a next available soft bit in the input buffer at a location in an output buffer corresponding the M-sequence bit memory location address.

* * * * *